US009346992B2

(12) United States Patent
Arancio et al.

(10) Patent No.: US 9,346,992 B2
(45) Date of Patent: May 24, 2016

(54) THERMALLY CONDUCTIVE DIELECTRIC FOR THERMOFORMABLE CIRCUITS

(71) Applicant: E I DU PONT DE NEMOURS AND COMPANY, Wilmington, DE (US)

(72) Inventors: Vincenzo Arancio, Bristol (GB); Jay Robert Dorfman, Durham, NC (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 196 days.

(21) Appl. No.: 14/330,075

(22) Filed: Jul. 14, 2014

(65) Prior Publication Data

US 2015/0034473 A1 Feb. 5, 2015

Related U.S. Application Data

(60) Provisional application No. 61/888,544, filed on Oct. 9, 2013, provisional application No. 61/860,288, filed on Jul. 31, 2013.

(51) Int. Cl.
| | | |
|---|---|---|
| *H01B 3/02* | (2006.01) | |
| *C09K 5/14* | (2006.01) | |
| *C09D 163/00* | (2006.01) | |
| *H01B 17/60* | (2006.01) | |
| *H01B 3/40* | (2006.01) | |
| *H01B 3/42* | (2006.01) | |
| *H01B 3/30* | (2006.01) | |
| *H03K 17/96* | (2006.01) | |

(52) U.S. Cl.
CPC .............. *C09K 5/14* (2013.01); *C09D 163/00* (2013.01); *H01B 3/025* (2013.01); *H01B 3/302* (2013.01); *H01B 3/40* (2013.01); *H01B 3/42* (2013.01); *H01B 17/60* (2013.01); *H03K 17/962* (2013.01)

(58) Field of Classification Search
CPC .......... H01B 3/302; H01B 3/40; H01B 17/60; H03K 17/962
See application file for complete search history.

(56) References Cited

U.S. PATENT DOCUMENTS

2013/0068512 A1* 3/2013 Dorfman ................ H01G 4/008
174/257

FOREIGN PATENT DOCUMENTS

| JP | WO 2012157627 A1 * 11/2012 | ......... C08G 18/0823 |
| WO | 2012157627 A1 11/2012 | |

OTHER PUBLICATIONS

U.S. Appl. No. 14/050,525, filed Oct. 20, 2013, Dorfman et al.
U.S. Appl. No. 14/175,085, filed Feb. 7, 2014, Dorfman et al.
U.S. Appl. No. 14/220,255, filed Mar. 20, 2014, Dorfman.
U.S. Appl. No. 14/324,760, filed Jul. 7, 2014, Dorfman.
International Report on Patentability Dated Feb. 2, 2016 for International Application No. PCT/US2014/048766.

* cited by examiner

*Primary Examiner* — Richard A Huhn

(57) ABSTRACT

This invention is directed to a polymer thick film thermally conductive thermoformable dielectric composition comprising urethane resin, thermoplastic phenoxy resin, diacetone alcohol and thermally conductive powder. Dielectrics made from the composition can be used in various electronic applications to protect electrical elements and particularly to insulate and protect both the conductive thermoformable silver and the polycarbonate substrate in capacitive switch applications. The thermoformed electrical circuit may be subsequently subjected to an injection molding process.

21 Claims, No Drawings

THERMALLY CONDUCTIVE DIELECTRIC FOR THERMOFORMABLE CIRCUITS

FIELD OF THE INVENTION

This invention is directed to a polymer thick film thermoformable dielectric composition with thermal conductivity. Dielectrics made from the composition can be used in various electronic applications to protect electrical elements and particularly to provide thermal conductivity in capacitive switches.

BACKGROUND OF THE INVENTION

Dielectrics have long been used to protect electrical elements. They have also been used as isolating layers. Although they have been used for years in these types of applications, the use of dielectrics as thermal conductors during thermoforming procedures is not common. This is particularly important in thermoformable capacitive circuits where highly conductive silver is used and heat must be prevented from accumulating within the circuit. Heat can have a deleterious effect on the performance of a circuit, often leading to unwanted resistance shifts. One of the purposes of this invention is to alleviate this issue and produce a thermoformable capacitive construction in which the heat generated can be managed.

SUMMARY OF THE INVENTION

This invention relates to a polymer thick film thermally conductive thermoformable dielectric composition comprising:
(a) 10-35 wt % first organic medium comprising 10-50 wt % urethane resin dissolved in 50-90 wt % first organic solvent, wherein the weight percent of the urethane resin and the first organic solvent are based on the total weight of the first organic medium;
(b) 10-35 wt % second organic medium comprising 10-50 wt % thermoplastic phenoxy resin dissolved in 50-90 wt % second
(c) organic solvent, wherein the weight percent of the thermoplastic phenoxy resin and the second organic solvent are based on the total weight of the second organic medium;
(d) 2-20 wt % diacetone alcohol, wherein the weight percent is based on the total weight of the composition; and
(e) 1-70 wt % of thermally conductive powder;
wherein the weight percent of the first organic medium, the second organic medium, the diacetone alcohol and the thermally conductive powder are based on the total weight of the composition.

The invention is further directed to using the thermally conductive thermoformable dielectric to form a protective and/or insulating layer in thermoformable capacitive electrical circuits.

DETAILED DESCRIPTION OF INVENTION

The invention relates to a polymer thick film thermally conductive thermoformable dielectric composition for use in thermoforming electrical circuits.

The substrate commonly used in polymer thick film thermoformable capacitive circuits is polycarbonate (PC). PC is generally preferred since it can be readily thermoformed. However, PC is very sensitive to the solvents used in the layers deposited on it. An inappropriate solvent can and will cause cracking or crazing in the PC substrate.

The polymer thick film (PTF) thermally conductive thermoformable dielectric composition is comprised of (i) two organic media comprising two polymer resins dissolved in the same or different organic solvents, (ii) diacetone alcohol organic solvent, and (iii) thermally conductive powder. Additionally, powders and printing aids may be added to the composition.

In one embodiment, the polymer thick film thermally conductive thermoformable dielectric composition can also be described as comprising urethane resin, thermoplastic phenoxy resin, diacetone alcohol and thermally conductive powder selected from the group consisting of boron nitride, aluminum nitride and alumina.

Organic Medium

The first organic medium is comprised of a urethane resin dissolved in a first organic solvent. The urethane resin must achieve good adhesion to both the electrical element, e.g., the silver layer that is deposited on it, and the underlying substrate onto which it is deposited. The urethane resin must also provide elasticity for thermoforming. It must be compatible with and not adversely affect the performance of the electrical element.

In one embodiment the urethane resin is 10-50 wt % and the first organic solvent is 50-90 wt % of the total weight of the first organic medium. In another embodiment the urethane resin is 25-45 wt % and the first organic solvent is 55-75 wt % of the total weight of the first organic medium. In still another embodiment the urethane resin is 15-25 wt % and the first organic solvent is 75-85 wt % of the total weight of the first organic medium. In one embodiment the urethane resin is a urethane elastomer. In another embodiment urethane resin is a polyester-based copolymer.

The second organic medium is composed of a phenoxy resin dissolved in a second organic solvent that may be the same as the first organic solvent. Different solvents may also be used. The phenoxy resin adds high temperature capability to the composition which aids in the use of this dielectric as a solder mask if required, and also improves moisture permeability. That is, it helps impede the progress of moisture through the composition. In one embodiment the phenoxy resin is 10-50 wt % and the second organic solvent is 50-90 wt % of the total weight of the second organic medium. In another embodiment the phenoxy resin is 20-35 wt % and the second organic solvent is 65-80 wt % of the total weight of the second organic medium.

In one embodiment, each medium is 10-35 wt % based on the total weight of the composition. In another embodiment, each medium is 15-30 wt % based on the total weight of the composition.

Although the preparation of two separate organic media are preferred, if the same solvent is to be used for both media a single organic medium equivalent to the two organic media described above may be used.

The polymer resin is typically added to the organic solvent by mechanical mixing to form the medium. Solvents suitable for use in the organic media of the polymer thick film composition are recognized by one of skill in the art and include acetates and terpenes such as carbitol acetate and alpha- or beta-terpineol or mixtures thereof with other solvents such as kerosene, dibutylphthalate, butyl carbitol, butyl carbitol acetate, hexylene glycol and high boiling alcohols and alcohol esters. In addition, volatile liquids for promoting rapid hardening after application on the substrate may be included. In many embodiments of the present invention, solvents such as glycol ethers, ketones, esters and other solvents of like boiling points (in the range of 180° C. to 250° C.), and mixtures thereof may be used. Various combinations of these and other solvents are formulated to obtain the viscosity and volatility requirements desired. The solvents used must solubilize the resin.

Diacetone Alcohol Organic Solvent

The polymer thick film thermally conductive thermoformable dielectric composition also contains the organic solvent diacetone alcohol. This particular solvent has been shown to be compatible with PC and does not cause any appreciable crazing of the substrate. In one embodiment the diacetone alcohol is 2-20 wt % based on the total weight of the composition. In another embodiment the diacetone alcohol is 3-10 wt % of the total weight based on the total weight of the composition and in still another embodiment the diacetone alcohol is 4-6 wt % based on the total weight of the composition.

Thermally Conductive Powder

The thermally conductive powder includes such powders. In one embodiment, the amount of thermally conductive powder is 1-70% of the total weight of the entire composition. In another embodiment the thermally conductive powder is 20-60 wt % of the total weight of the entire composition and in still another embodiment the thermally conductive powder is 40-55 wt % of the total weight of the entire composition. It is preferable to keep the particle size of the thermally conductive powder in the range of 1-10 microns so as to avoid any cracking issues.

Additional Powders

Various powders may be added to the PTF moisture barrier layer dielectric composition to improve adhesion, modify the rheology and increase the low shear viscosity thereby improving the printability. One such powder is fumed silica which has been found to significantly improve the resistance to moisture penetration.

Application of the PTF Thermally Conductive Thermoformable Dielectric Composition The PTF thermally conductive thermoformable dielectric composition, also referred to as a "paste", is typically deposited on a substrate, such as polycarbonate, that is somewhat impermeable to gases and moisture. The substrate can also be a sheet of a composite material made up of a combination of plastic sheet with optional metallic or dielectric layers deposited thereupon. In other constructions, the thermally conductive thermoformable dielectric may be deposited over an existing silver/dielectric construction.

The deposition of the PTF thermally conductive thermoformable dielectric composition is performed typically by screen printing, but other deposition techniques such as stencil printing, syringe dispensing or coating techniques can be utilized. In the case of screen-printing, the screen mesh size controls the thickness of the deposited thick film.

Generally, a thick film composition comprises a functional phase that imparts appropriate electrically functional properties to the composition. The functional phase comprises electrically functional powders dispersed in an organic medium that acts as a carrier for the functional phase. Generally, the composition is fired to burn out both the polymer and the solvent of the organic medium and to impart the electrically functional properties. However, in the case of a polymer thick film, the polymer portion of the organic medium remains as an integral part of the composition after drying.

The PTF thermally conductive thermoformable dielectric composition is processed for a time and at a temperature necessary to remove all solvent. For example, the deposited thick film is typically dried by exposure to heat at 130° C. for 10-15 min.

Capacitive Circuit Construction

The base substrate used is typically 10 mil thick polycarbonate. A moisture barrier layer dielectric, e.g., as described in U.S. Pat. No. 8,785,799, is printed and dried as per the conditions described above. Several layers can be printed and dried. A thermoformable conductive silver composition such as DuPont 5043 is then printed and dried under the same conditions used for the barrier layer. A moisture barrier layer may then be printed above the silver conductor as well forming a protective sandwich. The thermally conductive thermoformable dielectric is then deposited. A subsequent step which may include thermoforming of the entire unit is typical in the production of 3D circuits. If the moisture barrier layer dielectric is not used, the silver composition will be subject to moisture penetration through the polycarbonate substrate and the functional circuit will suffer, often leading to reduced lifetimes.

In the course of producing a 3-dimensional capacitive circuit, after the thermoforming step, the final step will often be a molding step in which the finished circuit is formed by injection molding using a resin such as polycarbonate. This process is referred to as in-molding and involves higher temperatures. Depending on the resin chosen, these temperatures can typically exceed 250° C. for 10-30 sec. Thus the choice of the resins used in the PTF composition is critical. The combination of the resins used in the instant PTF composition has been shown to survive the in-mold process and produce fully functional circuitry whereas most resins typically used in PTF compositions will not.

EXAMPLE AND COMPARATIVE EXPERIMENTS

Example 1

The PTF thermally conductive thermoformable dielectric composition was prepared in the following manner. The first organic medium was prepared by mixing 20.0 wt % Desmocoll 540 polyurethane (Bayer MaterialScience LLC, Pittsburgh, Pa.) with 80.0 wt % dibasic esters (DuPont Co., Wilmington, Del.) as the organic solvent. The molecular weight of the resin was approximately 40,000. This mixture was heated at 90° C. for 1-2 hours to dissolve all the resin. The second organic medium was prepared by adding 27.0 wt % PKHH (phenoxy) resin (InChem Corp.) to 73.0 wt % dibasic esters and heating as above. The above weight percent are based on the total weight of each of the media, respectively. All following weight percent are based on the total weight of the PTF thermally conductive thermoformable dielectric composition. 48.5 wt % boron nitride powder (Saint-Gobain Corp) was then added. 5 wt % diacetone alcohol (obtained from Eastman Chemical, Kingsport, Tenn.) was added and the entire composition was mixed. The composition was then subjected to the three-roll-mill for two cycles at 150 psi.

The composition, based on the total weight of the composition, was:

| | |
|---|---|
| 23.50 wt % | First Organic Medium |
| 23.00 wt % | Second Organic Medium |
| 5.00 wt % | Diacetone Alcohol Solvent |
| 48.50 wt % | Boron Nitride Powder |

A circuit was then fabricated as follows: On a 10 mil thick polycarbonate substrate, a blanket print of a moisture barrier dielectric composition described in U.S. Pat. No. 8,785,799 was printed with a 200 stainless steel screen and dried at 120°

C. for 10 min. A second print of the same composition was then printed and dried. A pattern of silver lines were printed with DuPont silver paste 5043 (Du Pont Co., Wilmington, Del.) using a 280 mesh stainless steel screen. The patterned lines were dried at 120° C. for 15 min. in a forced air box oven. The thermally conductive thermoformable dielectric composition prepared as described above was printed with a 280 SS screen and dried at 130° C. for 10 min. The part was inspected and no evidence of crazing or deformation of the underlying substrate was found. The circuit was then subjected to thermoforming conditions (160° C. for 10 sec). Resistance was then measured and recorded. The part was then subjected to powered 85° C./85% relative humidity (R.H.) for 100 hours to simulate accelerated aging conditions and resistance was measured. The change in resistance as a result of the simulated aging was recorded as Delta R and is shown in Table I.

Comparative Experiment A

A circuit was produced exactly as described in Example 1. The only difference was that the thermally conductive thermoformable dielectric composition was not used. The change in resistance as a result of the simulated aging was recorded as Delta R and is shown in Table I.

Comparative Experiment B

A circuit was produced exactly as described in Example 1. The difference was that the moisture barrier layer dielectric composition was printed both below and above the 5043 silver conductor and the thermally conductive thermoformable dielectric composition was not used. The change in resistance as a result of the simulated aging was recorded as Delta R and is shown in Table I.

The improvement in performance as a result of the thermally conductive thermoformable dielectric is apparent from the results shown in Table I.

TABLE 1

|  | Description | Delta R |
|---|---|---|
| Comp. Exp. A | Moisture Barrier + 5043 Silver | −39.0% |
| Comp. Exp. B | Moisture Barrier + 5043 Silver + Moisture Barrier | −9.6% |
| Example 1 | Moisture Barrier + 5043 Silver + Thermally Conductive Dielectric | −2.2% |

What is claimed is:

1. A polymer thick film thermally conductive thermoformable dielectric composition comprising:
   (a) 10-35 wt % first organic medium comprising 10-50 wt % urethane resin dissolved in 50-90 wt % first organic solvent, wherein the weight percent of the urethane resin and the first organic solvent are based on the total weight of the first organic medium;
   (b) 10-35 wt % second organic medium comprising 10-50 wt % thermoplastic phenoxy resin dissolved in 50-90 wt % second organic solvent, wherein the weight percent of the thermoplastic phenoxy resin and the second organic solvent are based on the total weight of the second organic medium;
   (c) 2-20 wt % diacetone alcohol, wherein the weight percent is based on the total weight of the composition; and
   (d) 1-70 wt % thermally conductive powder;
   wherein the weight percent of said first organic medium, said second organic medium, said diacetone alcohol and said thermally conductive powder are based on the total weight of the composition.

2. The polymer thick film thermally conductive thermoformable dielectric composition of claim 1, wherein said urethane resin is a urethane elastomer or a polyester-based copolymer.

3. The polymer thick film thermally conductive thermoformable dielectric composition of claim 2, wherein said urethane resin is a polyester-based copolymer.

4. The polymer thick film thermally conductive thermoformable dielectric composition of claim 1, wherein said thermally conductive powder is selected from the group consisting of boron nitride, aluminum nitride, alumina, and mixtures thereof.

5. The polymer thick film thermally conductive thermoformable dielectric composition of claim 4, wherein said thermally conductive powder is boron nitride.

6. The polymer thick film thermally conductive thermoformable dielectric composition of claim 1, comprising:
   (a) 15-35 wt % first organic medium comprising 15-25 wt % urethane resin dissolved in 75-85 wt % first organic solvent, wherein the weight percent of the urethane resin and the first organic solvent are based on the total weight of the first organic medium;
   (b) 15-35 wt % second organic medium comprising 20-35 wt % thermoplastic phenoxy resin dissolved in 65-80 wt % second organic solvent, wherein the weight percent of the thermoplastic phenoxy resin and the second organic solvent are based on the total weight of the second organic medium;
   (c) 3-10 wt % diacetone alcohol; and
   (d) 20-60 wt % thermally conductive powder;
   wherein the weight percent of said first organic medium, said second organic medium, said diacetone alcohol and said thermally conductive powder are based on the total weight of the composition.

7. A polymer thick film thermally conductive thermoformable dielectric composition comprising:
   (a) urethane resin;
   (b) thermoplastic phenoxy resin;
   (c) diacetone alcohol; and
   (d) thermally conductive powder.

8. The polymer thick film thermally conductive thermoformable dielectric composition of claim 7, wherein said urethane resin is a urethane elastomer or a polyester-based copolymer.

9. The polymer thick film thermally conductive thermoformable dielectric composition of claim 8, wherein said urethane resin is a polyester-based copolymer.

10. A capacitive switch circuit comprising a thermally conductive thermoformable dielectric formed from the polymer thick film thermally conductive thermoformable dielectric composition of claim 1.

11. The capacitive switch circuit of claim 10, wherein said urethane resin of said polymer thick film thermally conductive thermoformable dielectric composition of claim 1 is a urethane elastomer or a polyester-based copolymer.

12. The capacitive switch circuit of claim 10, wherein said thermally conductive powder of said polymer thick film thermally conductive thermoformable dielectric composition of claim 1 is selected from the group consisting of boron nitride, aluminum nitride, alumina, and mixtures thereof.

13. The capacitive switch circuit of claim 10, further comprising a polycarbonate substrate.

14. The capacitive switch circuit of claim 10, wherein said circuit is thermoformed.

15. The capacitive switch circuit of claim 11, wherein said circuit is thermoformed.

16. The capacitive switch circuit of claim 12, wherein said circuit is thermoformed.

17. The capacitive switch circuit of claim 13, wherein said circuit is thermoformed.

18. The capacitive switch circuit of claim 14, wherein said capacitive switch circuit has been subsequently subjected to an injection molding process.

19. The capacitive switch circuit of claim 15, wherein said capacitive switch circuit has been subsequently subjected to an injection molding process.

20. The capacitive switch circuit of claim 16, wherein said capacitive switch circuit has been subsequently subjected to an injection molding process.

21. The capacitive switch circuit of claim 17, wherein said capacitive switch circuit has been subsequently subjected to an injection molding process.

\* \* \* \* \*